(12) United States Patent
Abe et al.

(10) Patent No.: US 11,864,310 B2
(45) Date of Patent: Jan. 2, 2024

(54) STRETCHABLE LAMINATE, MATERIAL FOR STRETCHABLE DEVICE, AND STRETCHABLE DEVICE

(71) Applicant: PANASONIC INTELLECTUAL PROPERTY MANAGEMENT CO., LTD., Osaka (JP)

(72) Inventors: Takatoshi Abe, Osaka (JP); Tomohiro Fukao, Osaka (JP); Tomoaki Sawada, Osaka (JP); Kyosuke Michigami, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 128 days.

(21) Appl. No.: 17/603,781

(22) PCT Filed: Apr. 16, 2020

(86) PCT No.: PCT/JP2020/016729
§ 371 (c)(1),
(2) Date: Oct. 14, 2021

(87) PCT Pub. No.: WO2020/213681
PCT Pub. Date: Oct. 22, 2020

(65) Prior Publication Data
US 2022/0201850 A1 Jun. 23, 2022

(30) Foreign Application Priority Data
Apr. 18, 2019 (JP) .................................. 2019-079144

(51) Int. Cl.
*H05K 1/02* (2006.01)
*A41D 1/00* (2018.01)
*H05K 1/09* (2006.01)

(52) U.S. Cl.
CPC ........... *H05K 1/0283* (2013.01); *A41D 1/002* (2013.01); *H05K 1/09* (2013.01); *H05K 2201/0311* (2013.01); *H05K 2201/0355* (2013.01)

(58) Field of Classification Search
CPC ............. H05K 1/09; H05K 2201/0311; H05K 2201/0355; A41D 1/002
See application file for complete search history.

(56) References Cited

U.S. PATENT DOCUMENTS 9,338,915 B1 * 5/2016 Liu .................... H01M 10/0436
2002/0076948 A1 * 6/2002 Farrell ................. H05K 3/0058
2/243.1

(Continued)

FOREIGN PATENT DOCUMENTS

JP 2000-174424 6/2000
JP 2016-219782 12/2016

(Continued)

OTHER PUBLICATIONS

ISR issued in WIPO Patent Application No. PCT/JP2020/016729, dated Jun. 23, 2020, English translation Primary Examiner — Hoa C Nguyen
(74) Attorney, Agent, or Firm — GREENBLUM & BERNSTEIN, P.L.C.

(57) ABSTRACT

A stretchable laminate to be fixed to a fabric includes a stretchable circuit board including a stretchable insulating layer having an elongation rate of 10% or more, a fabric base material, and an adhesive layer that bonds the stretchable circuit board and the fabric base material together.

14 Claims, 13 Drawing Sheets

(56) References Cited

U.S. PATENT DOCUMENTS

| | | | | |
|---|---|---|---|---|
| 2008/0258314 | A1* | 10/2008 | Yoo | H01L 23/14 |
| | | | | 257/784 |
| 2016/0353567 | A1 | 12/2016 | Ichiryu et al. | |
| 2017/0056682 | A1* | 3/2017 | Kumar | G16H 50/20 |
| 2017/0086513 | A1* | 3/2017 | Maxey | A41D 1/04 |
| 2017/0340226 | A1 | 11/2017 | Takagahara et al. | |
| 2018/0020936 | A1 | 1/2018 | Kwon et al. | |
| 2018/0199443 | A1* | 7/2018 | Okumura | H05K 1/0283 |
| 2018/0199635 | A1* | 7/2018 | Longinotti-Buitoni | |
| | | | | A41B 1/08 |
| 2018/0295895 | A1* | 10/2018 | Donohoe | A61B 5/6807 |
| 2019/0075652 | A1* | 3/2019 | Nakajima | A61B 5/0205 |
| 2019/0077930 | A1 | 3/2019 | Irie et al. | |
| 2019/0209028 | A1* | 7/2019 | Baxi | A61B 5/25 |
| 2019/0273199 | A1 | 9/2019 | Tajitsu et al. | |
| 2019/0364983 | A1* | 12/2019 | Nakajima | A41H 3/06 |
| 2019/0373724 | A1* | 12/2019 | Gouthez | B32B 27/40 |
| 2020/0154563 | A1* | 5/2020 | Sim | H05K 1/0353 |
| 2020/0157713 | A1* | 5/2020 | Nakajima | H01B 13/008 |
| 2020/0281073 | A1* | 9/2020 | Okimoto | H05K 1/189 |
| 2020/0291273 | A1* | 9/2020 | Kwon | H01B 1/24 |

FOREIGN PATENT DOCUMENTS

| | | |
|---|---|---|
| JP | 2017-139413 | 8/2017 |
| JP | 2017-168437 | 9/2017 |
| JP | 2018-074001 | 5/2018 |
| JP | 2018-135629 | 8/2018 |
| WO | 2016/093194 | 6/2016 |
| WO | 2016/114298 | 7/2016 |
| WO | 2018/199084 | 11/2018 |

\* cited by examiner

STRETCHABLE LAMINATE, MATERIAL FOR STRETCHABLE DEVICE, AND STRETCHABLE DEVICE

TECHNICAL FIELD

The present invention relates to a stretchable laminate, a material for stretchable device, and a stretchable device.

BACKGROUND ART

With the advancement of the electronics field, there is an increasing demand for miniaturization, thinning, weight reduction, and densification of electronic devices and the like. Depending on the application, a flexible device that can be disposed on a curved face, an uneven face and the like, freely deformed, or bent is required in some cases. Examples of such a flexible device include wearable devices that can be worn on animals such as humans and dogs, and plants.

With regard to techniques used for wearable devices and the like, examples of bioelectrodes that can be attached to clothes include the bioelectrode described in Patent Literature 1. Examples of stretchable electrodes and wiring sheets for incorporating electric wiring into clothes include the stretchable electrode and wiring sheet described in Patent Literature 2. Examples of laminated sheets used for clothes with electrodes include the laminated sheet described in Patent Literature 2.

Patent Literature 1 describes clothing which is provided with a bioelectrode including an attachment member formed of an electrically insulating member fixed to the face, which comes into contact with a living body, of the clothing, an electrode portion formed of a conductive member fixed to a face, which comes into contact with a living body, of the attachment member, a connector that is fixed to the attachment member and is used for connection to a bioelectric signal measuring device, wiring that is fixed to the attachment member and electrically connects the connector and the electrode portion, and an electrically insulating first insulating member that covers the part, which comes into contact with a living body, of the surface of the wiring, and in which the bioelectrode is fixed so that the electrode portion comes into contact with a living body.

According to Patent Literature 1, it is disclosed that a short circuit between the wiring and the living body or a short circuit between a plurality of electrode portions can be prevented even if the clothing gets wet with sweat and the like in a state where the attachment member is attached to the clothing, and a desired bioelectric signal can be acquired.

Patent Literature 2 describes a stretchable electrode and a wiring sheet, which are a sheet-shaped electrode and wiring that can be laminated on a base material and in which the electrode is formed of a first insulating layer and a stretchable conductor layer provided on the first insulating layer, the wiring has a three-layer structure of the first insulating layer—the stretchable conductor layer—a second insulating layer, the electrical resistance of the stretchable conductor layer is 300 Ω/cm or less, and the load at the time of elongation of the electrode and the wiring at an elongation rate of 10% is 100 N or less.

According to Patent Literature 2, it is disclosed that high conductivity can be maintained when the electrode and the wiring are elongated, that is, high conductivity can be maintained both when the electrode and the wiring are not elongated and when the electrode and the wiring are elongated.

Patent Literature 3 describes a laminated sheet including a release sheet, a stretchable conductive layer laminated on the release sheet, and a hot melt layer laminated on the stretchable conductive layer.

According to Patent Literature 3, it is disclosed that clothes with stretchable conductive layer can be manufactured by laminating the laminated sheet with the hot melt layer directed toward cloth.

As described above, wearable devices are used in a state of being integrated with the fabric of clothes or the like in some cases. In this case, the circuit board provided in the wearable device is not only required to be flexible but also required to be easily integrated with the fabric of clothes or the like.

CITATION LIST

Patent Literature

Patent Literature 1: WO 2016/093194 A
Patent Literature 2: WO 2016/114298 A
Patent Literature 3: JP 2018-135629 A

SUMMARY OF INVENTION

The present invention has been made in view of such circumstances, and an object thereof is to provide a stretchable laminate capable of suitably fixing a stretchable circuit board to a fabric, a material for stretchable device capable of suitably fixing a stretchable circuit board to a fabric, and a stretchable device in which a stretchable circuit board is suitably fixed to a fabric.

An aspect of the present invention is a stretchable laminate to be fixed to a fabric, the stretchable laminate including a stretchable circuit board including an stretchable insulating layer having an elongation rate of 10% or more, a fabric base material, and an adhesive layer that bonds the stretchable circuit board and the fabric base material together.

Another aspect of the present invention is a material for stretchable device including a stretchable circuit board that is fixed to a fabric, and a release sheet, in which the stretchable circuit board includes a stretchable insulating layer having an elongation rate of 10% or more and the stretchable circuit board and the release sheet are laminated with an adhesive layer interposed therebetween.

DESCRIPTION OF EMBODIMENTS

The present inventors have paid attention to the fact that it has not been investigated so much that conventional circuit boards are easily integrated with fabrics of clothes and the like. For example, in the techniques disclosed in Patent Literatures 1 to 3 as well, it has not been investigated that circuit boards are easily integrated with fabrics of clothes and the like.

As a result of various investigations, the present inventors have found out that the above object to provide a stretchable laminate capable of suitably fixing a stretchable circuit board to a fabric, a material for stretchable device capable of suitably fixing a stretchable circuit board to a fabric, and a stretchable device in which a stretchable circuit board is suitably fixed to a fabric can be achieved by the following present invention.

Hereinafter, embodiments according to the present invention will be described, but the present invention is not limited thereto.

Figure 1:
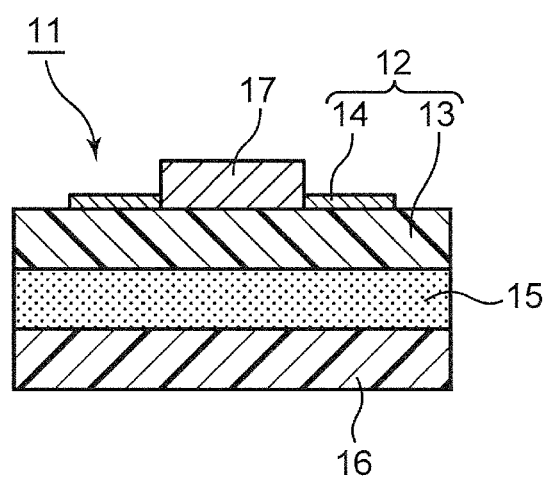
FIG. 1 is a sectional view illustrating an example of a material for stretchable device according to an embodiment of the present invention.
Figure 2:
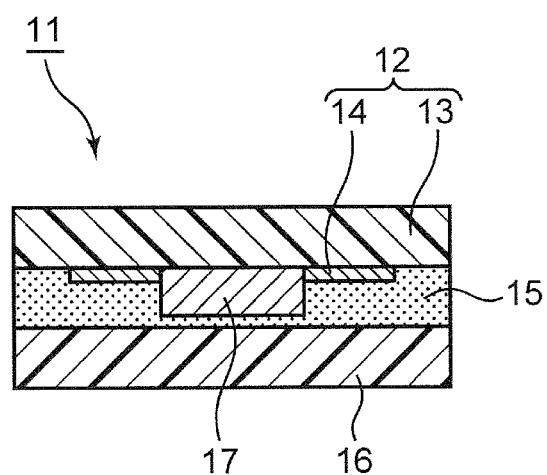
FIG. 2 is a sectional view illustrating another example of a material for stretchable device according to an embodiment of the present invention.

A material for stretchable device 11 according to an embodiment of the present invention includes a stretchable circuit board 12 including a stretchable insulating layer 13, an adhesive layer 15 that is disposed on one face of the stretchable circuit board 12, and a release sheet 16 that is disposed on the adhesive layer 15 as illustrated in FIGS. 1 and 2. FIG. 1 is a sectional view illustrating an example of the material for stretchable device 11 according to the present embodiment. FIG. 2 is a sectional view illustrating another example of the material for stretchable device 11 according to the present embodiment.

Such a material for stretchable device can be suitably used for suitably fixing a stretchable circuit board to a fabric. Specifically, the stretchable circuit board can be fixed to the fabric with the adhesive layer interposed therebetween by only peeling off the release sheet from the material for stretchable device and pasting the material for stretchable device to the fabric so that the adhesive layer comes into contact with the fabric. In the material for stretchable device, the stretchable circuit board is provided on the release sheet with the adhesive layer interposed therebetween. By this, the position of the stretchable circuit board is fixed by the release sheet, and thus an electronic component and the like can be easily mounted on the stretchable circuit board with solder.

As illustrated in FIGS. 1 and 2, it is preferable that an electronic component 17 is mounted on the material for stretchable device 11. This makes it possible to impart the function of the electronic component to the stretchable circuit board fixed to the fabric. When the electronic component 17 is mounted on the stretchable circuit board 12, the face on which the electronic component 17 is mounted may be the face on the opposite side to the face in contact with the adhesive layer 15 as illustrated in FIG. 1 or the face in contact with the adhesive layer 15 as illustrated in FIG. 2. In other words, the material for stretchable device 11 may further include the electronic component 17 mounted on the face on the opposite side to the face in contact with the adhesive layer 15 of the stretchable circuit board 12 as illustrated in FIG. 1. The material for stretchable device 11 may further include the electronic component 17 mounted on the face in contact with the adhesive layer 15 of the stretchable circuit board 12 as illustrated in FIG. 2. In a case where the face on which the electronic component 17 is mounted is the face in contact with the adhesive layer 15, when the stretchable laminate is fixed to the fabric, the electronic component is sandwiched between the stretchable circuit board and the fabric and embedded in the adhesive layer, and thus the electronic component is protected.

The stretchable circuit board 12 further includes, for example, a member provided in a conventional circuit board, in addition to the stretchable insulating layer 13. For example, as illustrated in FIGS. 1 and 2, the stretchable circuit board 12 is preferably a circuit board including the stretchable insulating layer 13 and stretchable wiring 14 provided on the stretchable insulating layer 13. To provide the stretchable wiring is to form an electronic circuit or an electrode for sensor. By providing stretchable wiring as the wiring provided on the circuit board, the stretchability of the stretchable circuit board can be maintained. As illustrated in FIGS. 1 and 2, it is preferable that the electronic component 17 is electrically connected to the stretchable wiring 14. This makes it possible to suitably exert the function of the electronic component.

The adhesive layer 15 is a layer capable of bonding the stretchable circuit board 12 and the fabric together, and examples thereof include layers containing hot melt adhesives such as vinyl acetate copolymer-based hot melt adhesives, polyolefin-based hot melt adhesives, polyamide-based hot melt adhesives, various synthetic rubbers-based hot melt adhesives, acrylic hot melt adhesives, and polyurethane-based hot melt adhesives. Among these, it is preferable that the adhesive layer is formed of a hot melt adhesive. When the adhesive contained in the adhesive layer is a hot melt adhesive, bonding can be performed only by heating. For example, the stretchable circuit board can be easily bonded to the fabric using an iron or the like. As the adhesive contained in the adhesive layer, the adhesives exemplified above may be used singly or in combination of two or more thereof.

The release sheet 16 is a sheet that can be peeled off from the adhesive layer 15, and examples thereof include polyethylene terephthalate (PET) film, polyethylene naphthalate (PEN) film, polyphenylene sulfide (PPS) film, polyimide film, polytetrafluoroethylene film, silicone rubber film, and polyimide amide film. The release sheet may be films obtained by subjecting these films to peeling treatment.

Figure 3:
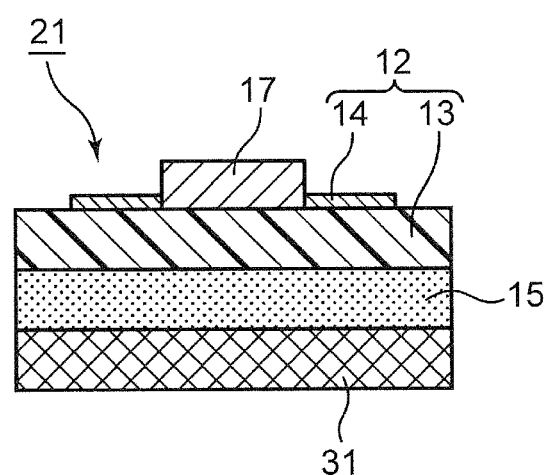
FIG. 3 is a sectional view illustrating an example of a stretchable laminate according to an embodiment of the present invention.
Figure 4:
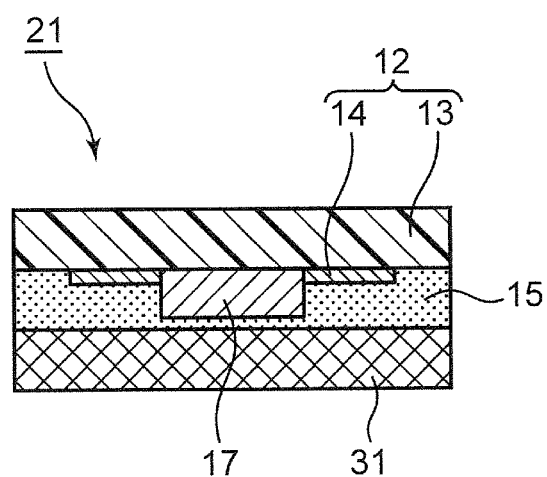
FIG. 4 is a sectional view illustrating another example of a stretchable laminate according to an embodiment of the present invention.
Figure 5:
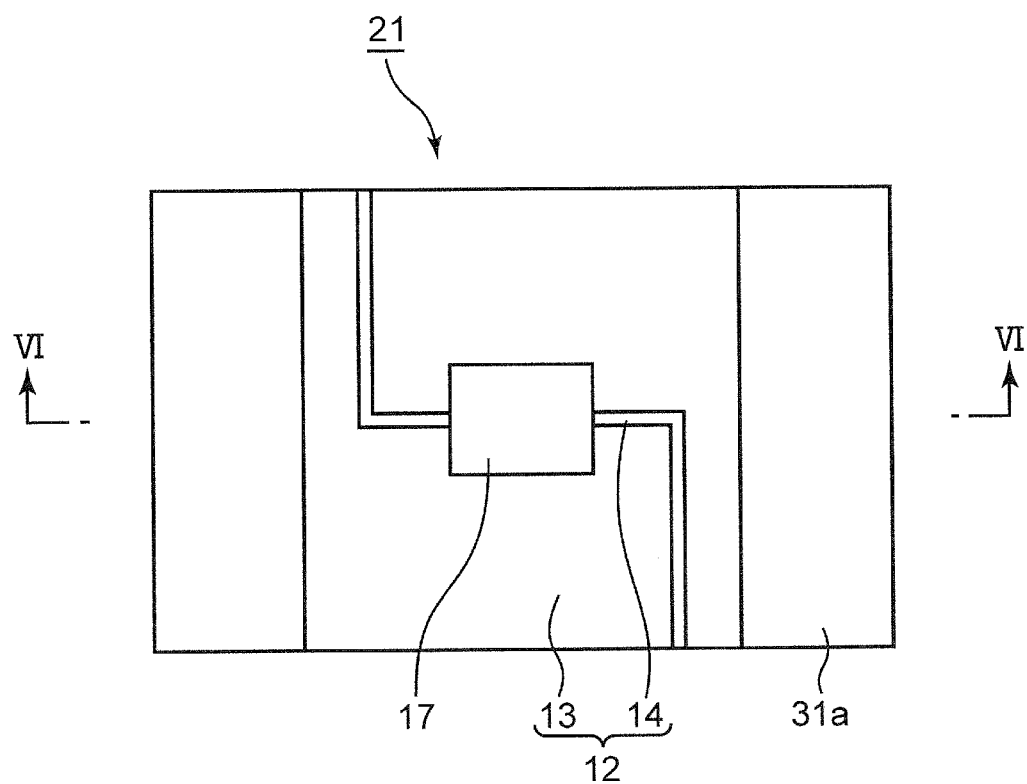
FIG. 5 is a top view illustrating another example of a stretchable laminate according to an embodiment of the present invention.
Figure 6:
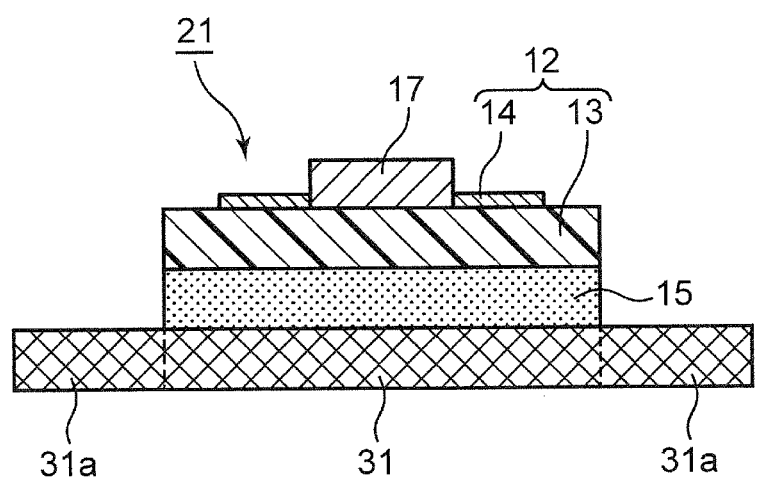
FIG. 6 is a sectional view of the stretchable laminate illustrated in FIG. 5 as viewed from a cut plane line VI-VI.
Figure 7:
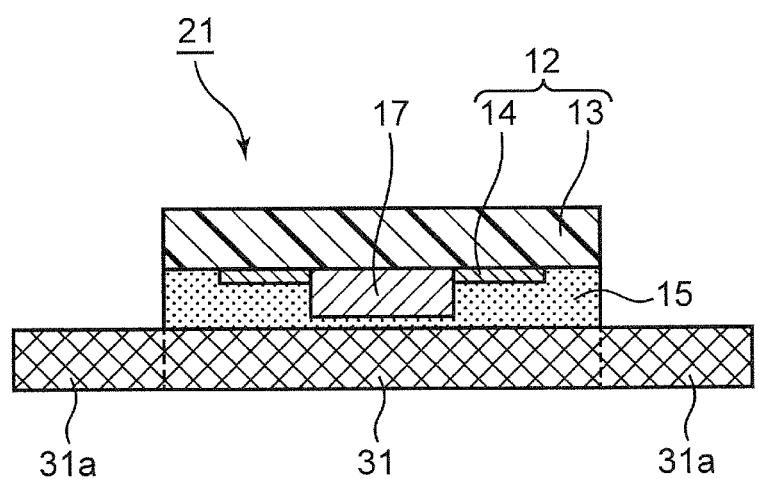
FIG. 7 is a sectional view illustrating another example of a stretchable laminate according to an embodiment of the present invention.
Figure 8:
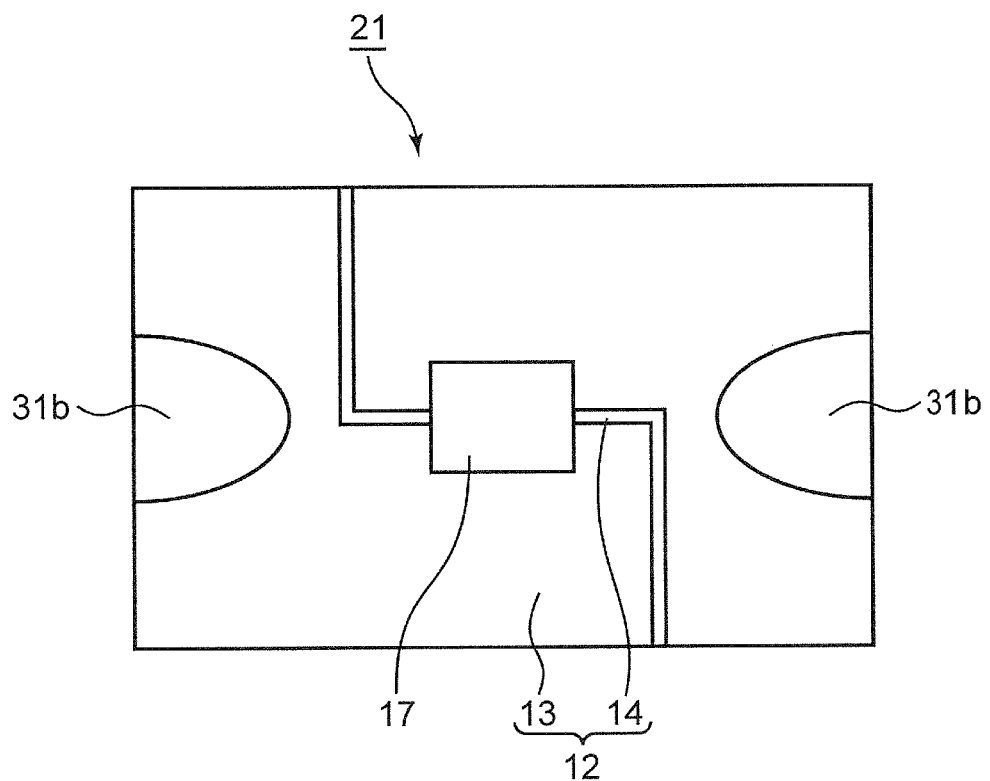
FIG. 8 is a top view illustrating another example of a stretchable laminate according to an embodiment of the present invention.

The stretchable laminate according to an embodiment of the present invention is a stretchable laminate to be fixed to a fabric. As illustrated in FIGS. 3 to 8, a stretchable laminate 21 includes a stretchable circuit board 12 including a stretchable insulating layer 13, a fabric base material 31, and an adhesive layer 15 that bonds the stretchable circuit board 12 and the fabric base material 31 together. In the stretchable laminate 21, the members, such as the stretchable circuit board 12 and the adhesive layer 15, other than the fabric base material may be the same as those in the material for stretchable device 11. FIG. 3 is a sectional view illustrating an example of the stretchable laminate according to an embodiment of the present invention. FIG. 4 is a sectional view illustrating another example of the stretchable laminate according to an embodiment of the present invention. FIG. 5 is a top view illustrating another example of the stretchable laminate according to an embodiment of the present invention. FIG. 6 is a sectional view of the stretchable laminate illustrated in FIG. 5 as viewed from the cut plane line VI-VI. FIG. 7 is a sectional view illustrating another example of the stretchable laminate according to an embodiment of the present invention. FIG. 8 is a top view illustrating another example of the stretchable laminate according to an embodiment of the present invention.

The stretchable laminate includes the fabric base material instead of the release film in the material for stretchable device. When the material for stretchable device is used, the stretchable circuit board can be fixed to the fabric with the adhesive layer interposed therebetween by only peeling off the release sheet from the material for stretchable device and pasting the material for stretchable device to the fabric so that the adhesive layer comes into contact with the fabric as described above. On the other hand, in such a stretchable laminate, the stretchable circuit board can be suitably fixed to a fabric by fixing the fabric base material to the fabric without peeling off the fabric base material. The fabric base material is easily sewn to the fabric, for example, when the fabric base material is sewn to the fabric to fix the stretchable laminate to the fabric. When the fabric base material is stuck to the fabric with an adhesive or the like to fix the stretchable laminate to the fabric as well, the fabric base material is easily stuck to the fabric since the fabric base material and the fabric are of the same kind. The stretchable laminate has a simple structure in which the stretchable circuit board is bonded to the fabric base material with the adhesive layer interposed therebetween, and thus the cost thereof is low. Since the fabric base material is supple, the suppleness of the stretchable circuit board is not impaired even when the fabric base material is bonded to the stretchable circuit board with the adhesive layer interposed therebetween.

Examples of the fabric base material 31 include fabrics containing polyester fiber, rayon, cotton, silk, fiberglass, hemp, palm fiber, rush, wool, metal fiber, slag cotton, lyocell, cupra, casein fiber, alginate fiber, chitin fiber, rubber fiber, acetate fiber, cellulose fiber, promix fiber, polyamide fiber, vinylidene fiber, acrylic fiber, polyethylene fiber, polypropylene fiber, and polyether ester fiber. As the fabric base material, the fibers exemplified may be used singly or in combination of two or more thereof. In other words, the fabric base material may be a fabric formed of a single fiber, a fabric formed of two or more fibers, or fabrics obtained by containing materials other than fibers in these fabrics. The fabric base material may be any fabric containing the fibers, and examples thereof include woven fabrics, knitted fabrics, and non-woven fabrics. The fabric base material may be a fabric the same as the fabric or a fabric different from the fabric. By using the fabric base material, the stretchable circuit board is reinforced by the fabric base material through the adhesive layer. For example, when the stretchable circuit board is sewn to a fabric constituting clothing or the like with a thread to be fixed without using the fabric base material, it is possible to prevent the stretchable circuit board from tearing from the sewn part. It is preferable that the fabric base material has the same elongation rate and tensile modulus as those of the stretchable insulating layer and the stretchable wiring since the followability to changes in the shape of clothing or the like is excellent when the stretchable laminate according to the present embodiment is fixed to a fabric used for clothing or the like.

The fabric base material can be replaced with a foamed resin sheet. In other words, the stretchable laminate may be a stretchable laminate to be fixed to a fabric, which includes a stretchable circuit board 12 including a stretchable insulating layer 13 having an elongation rate of 10% or more, a foamed resin sheet 31, and an adhesive layer 15 that bonds the stretchable circuit board 12 and the foamed resin sheet 31 together. In such a stretchable laminate, the stretchable circuit board can be suitably fixed to a fabric by fixing the foamed resin sheet to the fabric without peeling off the foamed resin sheet similar to the case where the fabric base material is provided.

Examples of the foamed resin sheet include sheets formed of foam materials such as urethane foam and polyethylene foam.

It is preferable that the surface unevenness of the fabric base material or the foamed resin sheet is larger than that of the stretchable insulating layer. This has an advantage in that the adhesive force between the fabric base material or the foamed resin sheet and the adhesive layer can be greater than the adhesive force between the stretchable insulating layer and the adhesive layer when the stretchable circuit board is bonded to the fabric with the adhesive layer interposed therebetween, and the respective adhesive layers can contain different components in the adhesive layer interposed between the stretchable circuit board and the fabric base material and the adhesive layer interposed between the fabric base material and the fabric.

The surface unevenness of the stretchable insulating layer, fabric base material, and foamed resin sheet of the present embodiment can be represented by the surface roughness Rz. In the present embodiment, the surface roughness Rz indicates a value measured based on JIS B 0031 (2003). Specifically, the surface roughness Rz can be measured using a surface roughness measuring instrument, for example, a Surftest SJ-310 (manufactured by Mitutoyo Corporation).

The surface roughness Rz of the stretchable insulating layer is preferably 0.5 µm or less, more preferably 0.1 µm or less. The lower limit value of the surface roughness Rz does not need to be particularly defined, but it is desirable that the surface roughness Rz of the stretchable insulating layer is about 0.01 µm or more from the viewpoint of productivity.

The surface roughness Rz of the fabric base material or the foamed resin sheet is preferably larger than 0.5 µm, more preferably 1.0 µm or more. The upper limit of the surface roughness Rz does not need to be particularly defined, but 100 µm is sufficient.

It is preferable that the fabric base material or the foamed resin sheet exhibits higher rigidity than the stretchable insulating layer. This has an advantage that the fabric base material or the foamed resin sheet also functions as a reinforcing material for the stretchable circuit board.

The material for stretchable device 11 and the stretchable laminate 21 may further include the electronic component 17 mounted on the face on the opposite side to the face in contact with the adhesive layer 15 of the stretchable circuit board 12 as illustrated in FIGS. 3 and 6 or the electronic component 17 mounted on the face in contact with the adhesive layer 15 of the stretchable circuit board 12 as illustrated in FIGS. 4 and 7. This makes it possible to impart the function of the electronic component to the material for stretchable device and the stretchable laminate. In a case where the face on which the electronic component 17 is mounted is the face in contact with the adhesive layer 15, when the material for stretchable device and the stretchable laminate are fixed to the fabric, the electronic component is sandwiched between the stretchable circuit board and the fabric and embedded in the adhesive layer, and thus the electronic component is protected.

It is preferable that the fabric base material 31 has an exposed portion 31a (31b) that is exposed when viewed from the stretchable circuit board 12 side in a state where the stretchable circuit board 12 and the fabric base material 31 are laminated with the adhesive layer 15 interposed therebetween as illustrated in FIGS. 5 to 8. It is preferable that the exposed portion is a protruding portion 31a, which protrudes from the stretchable circuit board 12, of the fabric base material 31 in a state where the stretchable circuit board 12 and the fabric base material 31 are laminated with the adhesive layer 15 interposed therebetween as illustrated in FIGS. 5 to 7. The exposed portion 31a (31b) can be fixed to the fabric. When the fabric base material has such an exposed portion, for example, it is also possible to fix the exposed portion of the fabric base material to be provided in the stretchable laminate and the fabric so that the face on the side, where the stretchable circuit board is provided, of the stretchable laminate faces the fabric. For example, by using the fabric base material that is large in the plane direction of the stretchable circuit board, the protruding portion can be provided over the whole circumference of the fabric base material. In this case, by fixing the protruding portion provided over the whole circumference of the fabric base material to the fabric, it is also possible cover the stretchable circuit board and to protect a stretchable circuit board that is the stretchable circuit board.

The exposed portion may not be the protruding portion, but may be a part formed by cutting out a part of the stretchable circuit board 12, for example, an exposed portion (notch portion) 31b formed by a notch or the like as illustrated in FIG. 8. In the case of such an exposed portion as well, the exposed portion of the fabric base material and the fabric can be fixed.

The stretchable insulating layer and the stretchable wiring in the present embodiment have stretchability. Here, "having stretchability" means that the material can be elastically deformed, and more specifically means that the material has an elongation rate of 10% or more and a tensile modulus of 0.5 to 500 MPa at room temperature of 25° C. Hence, the stretchable circuit board, the stretchable laminate, and the stretchable device in the present embodiment each have stretchability.

The elongation rate is preferably 25% or more, more preferably 50% or more, still more preferably 100% or more. It is more preferable as the elongation rate is higher, but the elongation rate is preferably 500% or less from the viewpoint that the thermoplastic resin undergoes plastic deformation and the original shape tends to be impaired when elongation occurs more than necessary. The tensile modulus at room temperature of 25° C. is 0.5 to 500 MPa, preferably 1 to 300 MPa, more preferably 2 to 200 MPa, still more preferably 5 to 100 MPa. When the elongation rate and the tensile modulus are within the ranges, the stretchable circuit board having the stretchable insulating layer is easily deformed into an arbitrary shape, and the stretchable circuit board exhibits excellent followability to deformation of clothing or the like, for example, when stuck to a fabric constituting clothing or the like. The tensile modulus refers to a storage modulus at 25° C. measured by performing temperature dependency measurement in a tensile test using a dynamic viscoelasticity measuring device. Examples of the dynamic viscoelasticity measuring device include DMS6100 manufactured by Seiko Instruments Inc.

The stretchable insulating layer preferably has a storage modulus of 500 kPa or more in a temperature range of 100° C. or more and less than 400° C. When the storage modulus in this temperature range is too low, there are cases where it is difficult to maintain the flatness of the stretchable insulating layer and it is thus difficult to fix the stretchable circuit board to the fabric when the electronic component is mounted on the stretchable insulating layer and when the stretchable laminate is stuck to a fabric or the like. The elastic modulus of the stretchable insulating layer is preferably higher, but practically the upper limit of the storage modulus of the stretchable insulating layer is about 3 MPa in the temperature range of 100° C. or more and less than 400° C. The storage modulus is thus more preferably 500 kPa or more and 3 MPa or less. In the case of a stretchable insulating layer having such a storage modulus, when the stretchable circuit board is stuck to a fabric constituting clothing or the like, the stretchable circuit board exhibits excellent followability to deformation of clothing or the like, is supple, has excellent texture, and is easily handled. Since the stretchable circuit board includes the stretchable insulating layer having a storage modulus as described above, electronic components and the like can be easily mounted on the stretchable circuit board with solder and also by a reflow method. The storage modulus in the present embodiment refers to the storage modulus in the temperature range of 100° C. or more and less than 400° C. measured by performing temperature dependency measurement in a tensile test using a dynamic viscoelasticity measuring device. Examples of the dynamic viscoelasticity measuring device include DMS6100 manufactured by Seiko Instruments Inc. According to the investigation by the present inventors, in a case of using a stretchable insulating layer having a storage modulus of 500 kPa or more and 3 MPa or less in the temperature range of 100° C. or more and less than 400° C., even when the stretchable laminate is stuck to a fabric or the like, the stretchable circuit board remains flat and it is easy to fix the stretchable circuit board to the fabric. The electronic components and the like can be easily mounted on the stretchable circuit board with solder.

The stretchable insulating layer preferably has a thermal decomposition temperature of 270° C. or more. When the thermal decomposition temperature is too low, concerns about discoloration, deformation, dimensional changes, and line contamination tend to increase in the mounting step in the manufacture of a device, such as mounting of the electronic component on the stretchable circuit board. The thermal decomposition temperature is preferably higher, but the upper limit of the thermal decomposition temperature of the stretchable insulating layer is about 400° C. The thermal decomposition temperature is thus more preferably 270° C. or more and 400° C. or less. The stretchable insulating layer having such a thermal decomposition temperature exhibits heat resistance that allows electronic components and the like to be mounted with solder. The thermal decomposition temperature here can be measured using, for example, TG/DTA6300 manufactured by Seiko Instruments Inc.

According to the investigation by the present inventors, in a case of using a stretchable insulating layer having a thermal decomposition temperature of 270° C. or more and 400° C. or less, deformation of the stretchable circuit board is sufficiently suppressed even when the electronic components and the like are mounted on the stretchable circuit board with solder, and the electronic components and the like can be easily mounted on the stretchable circuit board with solder. On the other hand, in a case of using a stretchable insulating layer having a thermal decomposition temperature of less than 270° C., the stretchable circuit board is deformed when the electronic component is mounted on the stretchable circuit board and there is a case where it is difficult to mount the electronic components and the like on the stretchable circuit board with solder as described above. In some cases, it is difficult to fix the stretchable circuit board to the fabric.

The stretchable insulating layer preferably contains a thermosetting resin. It is more preferable to contain, for example, a resin having a hydroxyl group in the molecule or a resin having an epoxy group in the molecule as the thermosetting resin from the viewpoint of heat resistance and curability. The stretchable laminate containing such a resin exhibits excellent heat resistance, and the stretchable circuit board provided in the stretchable laminate exhibits excellent dimensional stability. The stretchable circuit board has heat resistance that allows electronic components and the like to be mounted with solder, for example.

Examples of the stretchable wiring include wiring formed of a conductive stretchable material as described later. Examples of the stretchable wiring include wave-shaped wiring and meander wiring. The stretchable wiring may be wiring that is formed of a conductive stretchable material and has a shape as described above.

The stretchable wiring may be wiring in which at least a part of the stretchable wiring is formed of copper foil in addition to wiring formed of a conductive stretchable material and wiring having a shape as described above. In the case of such wiring of which a part is formed of copper foil, a land used for mounting of an electronic component or the like through solder can be suitably formed, existing facility can be used, and it is thus possible to cut down the manufacturing cost.

[Stretchable Insulating Layer]

The composition of the resin composition used for the stretchable insulating layer is not particularly limited as long as the cured product of the resin composition exhibits properties such as the elongation rate and tensile modulus described above.

Preferably, the resin composition contains a thermosetting resin and a curing agent of the thermosetting resin. More specific examples of the resin composition include a resin composition containing polyrotaxane (A), a thermosetting resin (B), and a curing agent (C). Hereinafter, each component will be described more specifically.

Specific examples of the polyrotaxane (A) include polyrotaxane as described in JP 4482633 B1 or WO 2015/052853 A. As the polyrotaxane (A), a commercially available product may be used, and specifically SeRM Super Polymer A1000 manufactured by ASM Inc., and the like can be used.

Examples of the thermosetting resin (B) include thermosetting resins such as epoxy resin, phenol resin, polyimide resin, urea resin, melamine resin, unsaturated polyester, and urethane resin without particular limitation, and it is preferable to use epoxy resin among these.

Examples of the epoxy resin include bisphenol A type epoxy resin, bisphenol F type epoxy resin, bisphenol S type epoxy resin, aralkyl epoxy resin, phenol novolac type epoxy resin, alkylphenol novolac type epoxy resin, biphenol type epoxy resin, naphthalene type epoxy resin, dicyclopentadiene type epoxy resin, epoxidized products of condensates of phenols and aromatic aldehydes having a phenolic hydroxyl group, triglycidyl isocyanurate, and alicyclic epoxy resin. Depending on the situation, one of these may be used singly or two or more thereof may be used in combination.

As the epoxy resin, for example, an epoxy resin having two or more epoxy groups in one molecule and a molecular weight of 500 or more is preferably exemplified. As such an epoxy resin, a commercially available product may be used, and examples thereof include JER1003 (manufactured by Mitsubishi Chemical Corporation, molecular weight: 1300, bifunctional), EXA-4816 (manufactured by DIC Corporation, molecular weight: 824, bifunctional), and YP50 (manufactured by NIPPON STEEL Chemical & Material Co., Ltd., molecular weight: 60,000 to 80,000, bifunctional).

Examples of an epoxy resin different from the epoxy resin include an epoxy resin having an alkylene oxide-modified modifying group having 2 to 3 carbon atoms, 4 mol or more of the modifying group contained in 1 mol of epoxy molecule, an epoxy group of 2 mol or more, and an epoxy equivalent of 450 eq/mol or more. By containing this epoxy resin as the thermosetting resin (B) and the curing agent (C), it is possible to obtain a resin composition in which the cured product thereof exhibits the extensibility and the tensile modulus. Specific examples of such an epoxy resin include propylene oxide added bisphenol A type epoxy resin (EP4003S manufactured by ADEKA Corporation) and ethylene oxide added hydroxyphenylfluorene type epoxy resin (EG-280 manufactured by Osaka Gas Chemicals Co., Ltd.). One of epoxy resins as described above may be used singly, or two or more thereof may be used concurrently.

The resin composition containing any single component of the polyrotaxane (A) or the thermosetting resin (B) and the curing agent (C) may be prepared, but it is preferable to prepare a resin composition containing both the components ((A) and (B)) and the curing agent (C) from the viewpoint of being easy to obtain a resin composition of which the cured product exhibits the extensibility and the tensile modulus.

The curing agent (C) is not particularly limited as long as it acts as a curing agent for the thermosetting resin (B). In particular, examples of the curing agent of epoxy resin, which can be preferably used, include curing agents of phenol resin, amine-based compounds, acid anhydrides, imidazole-based compounds, sulfide resin, dicyandiamide, and sulfonium salts. The curing agents (C) may be used singly or in combination of two or more thereof. The resin composition may contain a curing accelerator, if necessary. Examples of the curing accelerator include imidazole-based compounds.

Among the resin compositions, a cross-linking agent may be further added to a resin composition containing polyrotaxane (A). As such a cross-linking agent, any cross-linking agent can be used without particular limitation as long as it can form a structure that cross-links with at least a part of the cyclic molecule of polyrotaxane (at least one reactive group of the cyclic molecule of polyrotaxane). Specific examples thereof include isocyanate resin and cyanuric chloride.

The proportion of each component in the resin composition is not particularly limited as long as the effects of the present invention can be exerted. For example, when all the components (A), (B), and (C) are contained, the polyrotaxane (A) is about 10 to 80 parts by mass, more preferably about 30 to 50 parts by mass; the thermosetting resin (B) is 10 to 89.9 parts by mass, more preferably 30 to 50 parts by mass; and the curing agent (C) is 0.1 to 30 parts by mass, more preferably about 0.1 to 20 parts by mass where the sum of the components (A) to (C) is 100 parts by mass. When the resin composition of the present embodiment contains isocyanate resin as a cross-linking agent, the isocyanate resin can be added at 0 to 50 parts by mass, more preferably 10 to 40 parts by mass with respect to the components of the polyrotaxane (A). When the component (B) and the component (C) are contained but the component (A) is not contained, the thermosetting resin (B) is about 50 to 99 parts by mass, more preferably about 60 to 80 parts by mass; and the curing agent (C) is about 1 to 50 parts by mass, more preferably about 1 to 40 parts by mass where the total amount of the resin composition is 100 parts by mass.

The resin composition may contain other additives, for example, curing catalysts (curing accelerators), flame retardants, flame retardant promoters, leveling agents, and colorants, if necessary, in a range in which the effects of the present invention are not impaired.

The method for preparing the resin composition containing an epoxy resin is not particularly limited, and for example, an epoxy resin, a curing agent, and a solvent are mixed together so as to be uniform. The solvent used is not particularly limited, and for example, toluene, xylene, methyl ethyl ketone, and acetone can be used. These solvents may be used singly or in combination of two or more thereof. Here, an organic solvent for adjusting the viscosity and various additives may be further blended, if necessary.

By heating and drying the resin composition obtained as described above, the resin composition is cured while the solvent is evaporated and the insulating layer of the present embodiment can be thus obtained.

The method and device for heating and drying the resin composition and the conditions of these may be various means similar to those conventionally used or improved means thereof. The specific temperature and time for heating can be appropriately set depending on the cross-linking agent, solvent and the like used, but the resin composition can be cured by, for example, being heated and dried at 50° C. to 200° C. for about 60 to 180 minutes.

The insulating layer (a molded body that is a cured product of the resin composition or the like) thus obtained may be subjected to surface treatment in order to stably form wiring (conductive layer) on one surface of the insulating layer. Various additives, for example, antioxidants, weather stabilizers, flame retardants, and antistatic agents can be added in a range in which the properties of the insulating layer are not impaired.

[Stretchable Wiring]

Examples of the conductive stretchable material constituting the stretchable wiring include a conductive composition containing a conductive filler and a stretchable binder. Specific examples of the conductive composition include a resin composition which contains a resin (D) that serves as a stretchable binder, a curing agent (E) that reacts with the resin (D), and a conductive filler (F) and in which the resin (D) has a functional group having a functional group equivalent of 400 g/eq or more and 10000 g/eq or less, the resin (D) and the cured product of the conductive composition have a glass transition temperature (Tg) or a softening point of 40° C. or less or an elastic modulus of less than 1.0 GPa at 30° C., and the conductive filler (F) is formed of a conductive substance having an intrinsic volume resistivity of $1 \times 10^{-4}$ $\Omega \cdot$cm or less at room temperature.

Hereinafter, each component will be described.

Specific examples of the conductive composition include a resin composition which contains a resin (D) that serves as a stretchable binder, a curing agent (E) that reacts with the resin (D), and a conductive filler (F) and in which the resin (D) has a functional group having a functional group equivalent of 400 g/eq or more and 10000 g/eq or less, the resin (D) and the cured product of the conductive composition have a glass transition temperature (Tg) or a softening point of 40° C. or less or an elastic modulus of less than 1.0 GPa at 30° C., and the conductive filler (F) is formed of a conductive substance having an intrinsic volume resistivity of $1 \times 10^{-4}$ $\Omega \cdot$cm or less at room temperature.

The resin (D) preferably has a weight average molecular weight of 50,000 or more. Hence, it is considered that bleeding is less likely to occur when a conductive pattern is printed using the conductive composition. Meanwhile, the upper limit of the weight average molecular weight is not particularly limited, but the weight average molecular weight range of the resin (D) is preferably 50,000 or more and 3 million or less, more preferably 100,000 or more and 1 million or less since there is the possibility that the viscosity increases and the handleability decreases when the molecular weight exceeds 3 million.

As the curing agent (E), various curing agents can be used without particular limitation as long as they exhibit reactivity with the resin (D) as described above. Specific examples of the curing agent (E) include radical generators and photoacid generators such as imidazole-based compounds, amine-based compounds, phenol-based compounds, acid anhydride-based compounds, isocyanate-based compounds, mercapto-based compounds, onium salts, and peroxides.

The conductive filler (F) is formed of a conductive substance having an intrinsic volume resistivity of $1 \times 10^{-4}$ $\Omega \cdot$cm or less at room temperature. When a material having an intrinsic volume resistivity of more than $1 \times 10^{-4}$ $\Omega \cdot$cm at room temperature is used, the volume resistivity of the conductive composition thus prepared is approximately $1 \times 10^{-3}$ $\Omega \cdot$cm to $1 \times 10^{-2}$ $\Omega \cdot$cm although it depends on the amount of the material blended. Hence, when a circuit is formed, the resistance value becomes high and the power loss becomes large.

Examples of the conductive substance (conductive substance having an intrinsic volume resistivity of $1 \times 10^{-4}$ $\Omega \cdot$cm or less at room temperature) include single substances composed of metal elements such as silver, copper, and gold and compounds such as oxides, nitrides, carbides, and alloys containing these elements. In addition to the conductive filler (F), a conductive or semiconductive conduction auxiliary may be added to the conductive composition for the purpose of further improving the conductivity. As such a conductive or semiconductive auxiliary, conductive polymers, ionic liquids, carbon black, acetylene black, carbon nanotubes, and inorganic compounds used in antistatic agents can be used, and one may be used or two or more may be used at the same time.

The shape of the conductive filler (F) is preferably a flat shape, and the aspect ratio of the thickness to the in-plane longitudinal direction of the conductive filler (F) is preferably 10 or more. When the aspect ratio is 10 or more, not only the surface area of the conductive filler with respect to the mass ratio becomes large and the efficiency of conductivity increases but also the adhesiveness with the resin component becomes favorable and an effect of improving the stretchability is exerted. When the aspect ratio is 1000 or less, more favorable conductivity and printability can be secured, and the aspect ratio is preferably 10 or more and 1000 or less, more preferably 20 or more and 500 or less. An example of the conductive filler having such an aspect ratio is a conductive filler having a tapped density of 6.0 g/cm$^3$ or less measured by the tapping method. It is more preferable that the tapped density is 2.0 g/cm$^3$ or less since the aspect ratio becomes larger.

With regard to the proportion of the conductive filler (F) blended in the conductive composition, the proportion of the conductive filler (F) blended is preferably 40% to 95% by mass from the viewpoint of conductivity, cost, and printability, more preferably 60% to 85% by mass with respect to the total amount of the conductive composition as a mass ratio.

In addition to the above components, additives and the like can be added to the conductive composition depending on the purpose. Examples of the additives include elastomers, surfactants, dispersants, colorants, fragrances, plasticizers, pH adjusting agents, viscosity regulators, ultraviolet absorbers, antioxidants, and lubricants.

The particle size of the conductive filler (F) is not particularly limited, but the average particle size (particle size at a cumulative volume of 50%; D50) measured by the laser light scattering method is preferably 0.5 µm or more and 30 µm or less, more preferably 1.5 µm or more and 20 µm or less from the viewpoint of printability at the time of screen printing and a moderate viscosity in kneading of the blended material.

The conductive filler (F) is preferably a conductive filler having the surface subjected to coupling treatment. Alternatively, the conductive composition may contain a coupling agent. This has an advantage that the adhesiveness between the binder resin and the conductive filler is further improved.

As a coupling agent to be added to the conductive composition or used for coupling treatment of the conductive filler, any coupling agent can be used without particular limitation as long as it adsorbs on the filler surface or reacts with the filler surface. Specific examples of the coupling agent include silane coupling agents, titanate-based coupling agents, and aluminum-based coupling agents.

When the coupling agent is used in the conductive composition, the amount thereof added is preferably about 1% to 20% by mass with respect to the whole resin composition.

The proportion of each component in the conductive composition is not particularly limited as long as the effects of the present invention can be exerted. The blended proportion of the resin (D) to the curing agent (E) can be appropriately determined depending on the kinds of resin and curing agent in consideration of the equivalent ratio and the like.

In addition to the above components, additives and the like can be added to the conductive composition depending on the purpose. Examples of the additives include elastomers, surfactants, dispersants, colorants, fragrances, plasticizers, pH adjusting agents, viscosity regulators, ultraviolet absorbers, antioxidants, and lubricants.

The method for forming the stretchable wiring is not particularly limited, and examples thereof include a method in which a coating film of the conductive composition is formed by applying or printing the conductive composition on an insulating layer as described above and the desired wiring (conductive pattern) is formed.

The conductive pattern or the like by the wiring can be formed on the surface of the insulating layer according to steps as described below. In other words, a coating film is first formed by applying or printing the conductive composition on the insulating layer, and volatile ingredients contained in the coating film are removed by drying. By subsequent step of curing the resin (D) and the curing agent (E) by curing step such as heating or electron beam or light irradiation, and step of reacting the coupling agent with the conductive filler (F) and the resin (D) with the curing agent (E), the conductive pattern by the stretchable wiring can be formed. Each condition in the curing step and reacting step is not particularly limited, and may be appropriately set depending on the kinds and desired forms of resin, curing agent, filler and the like.

The step of applying the conductive composition onto a base material (onto the stretchable insulating layer) is not particularly limited, but for example, coating methods using applicators, wire bars, comma rolls, gravure rolls and the like and printing methods using screen, flat plate offset, flexo, inkjet, stamping, dispenser, squeegee and the like can be used.

Figure 9:
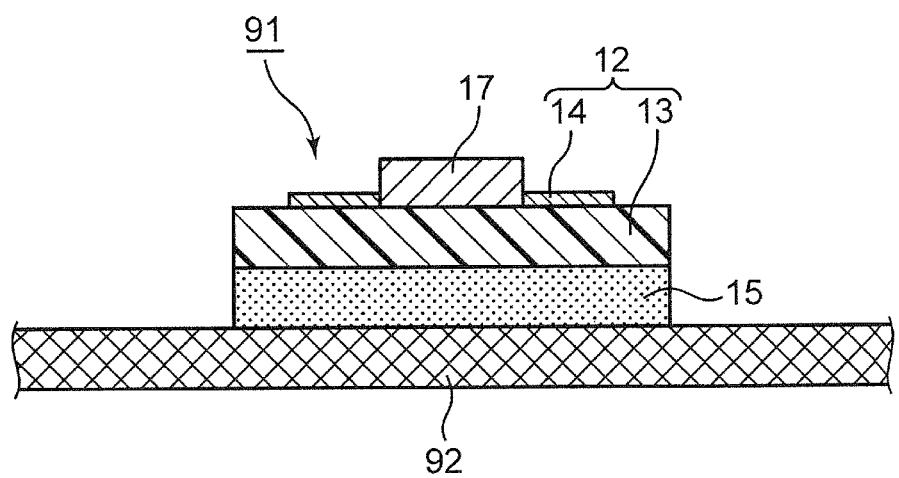
FIG. 9 is a sectional view illustrating an example of a stretchable device according to an embodiment of the present invention.

A stretchable device (first stretchable device) 91 according to an embodiment of the present invention includes the stretchable circuit board 12 and the adhesive layer 15 which are provided in the material for stretchable device; and a fabric 92 as illustrated in FIG. 9, and in the stretchable device, the stretchable circuit board 12 includes stretchable wiring 14 and an electronic component 17 that is electrically connected to the stretchable wiring 14. Such a stretchable device can be obtained by peeling off a release sheet from the material for stretchable device and pasting the material for stretchable device to the fabric. From this, the first stretchable device is a stretchable device in which the stretchable circuit board is fixed to the fabric with the adhesive layer interposed therebetween. FIG. 9 is a sectional view illustrating an example of the stretchable device 91 according to an embodiment of the present invention.

Figure 10:
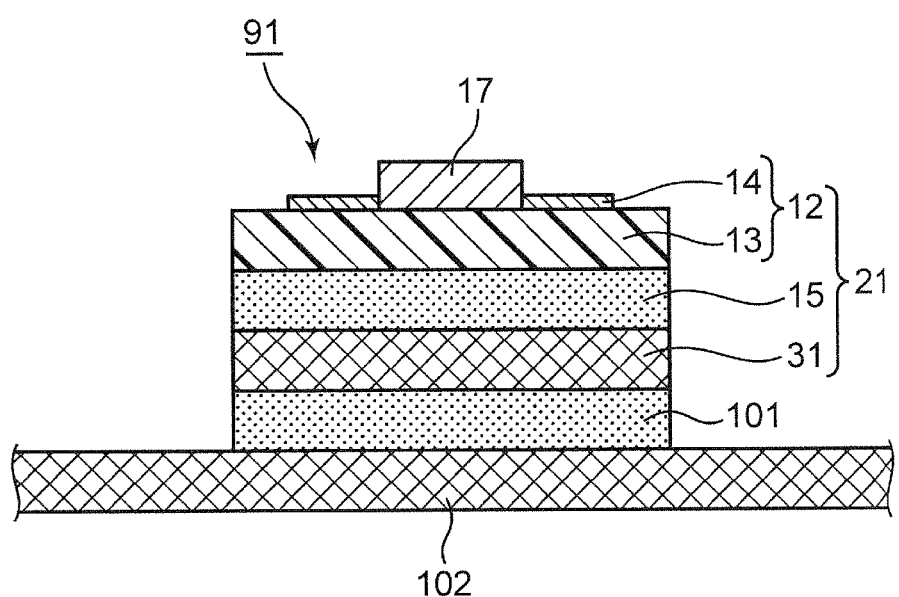
FIG. 10 is a sectional view illustrating another example of a stretchable device according to an embodiment of the present invention.

A stretchable device (second stretchable device) 91 according to an embodiment of the present invention includes the stretchable laminate 21 including the electronic component 17, a fabric 102, and a fixing member 101 for fixing the stretchable laminate 21 and the fabric 102 as illustrated in FIG. 10. The fixing member 101 may be, for example, similar to the adhesive layer 15 of the stretchable laminate 21. Such a stretchable device is obtained by fixing the fabric base material provided in the stretchable laminate to the fabric. From this, from this, the second stretchable device is a stretchable device in which the stretchable circuit board is fixed to a fabric. FIG. 10 is a sectional view illustrating another example of the stretchable device 91 according to an embodiment of the present invention.

Figure 11:
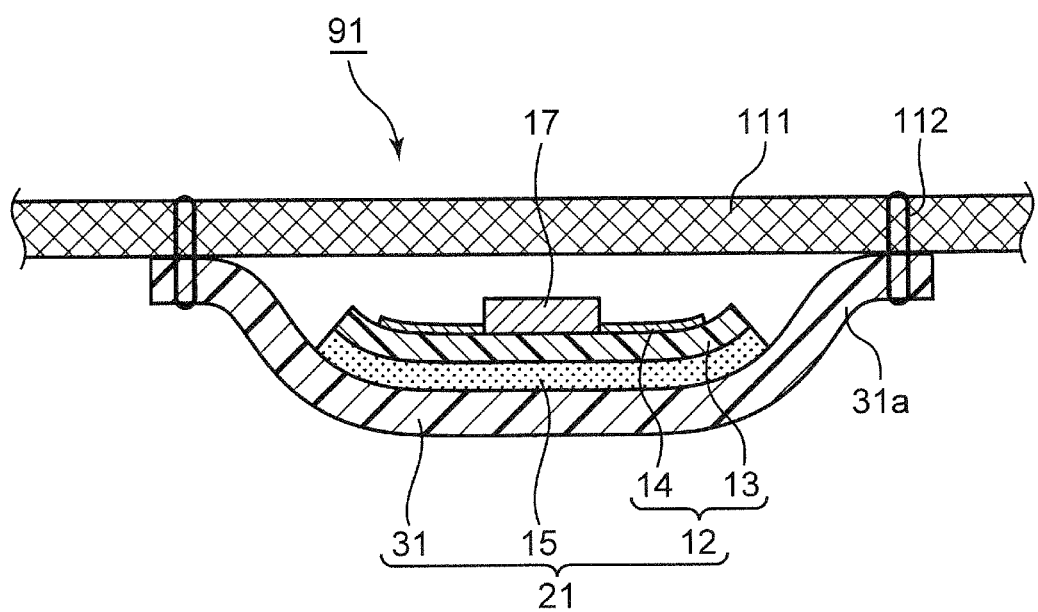
FIG. 11 is a sectional view illustrating another example of a stretchable device according to an embodiment of the present invention.

A stretchable device (third stretchable device) 91 according to an embodiment of the present invention is a stretchable device including the stretchable laminate 21 including the fabric base material 31 having the exposed portion 31a as illustrated in FIGS. 6 to 8. In other words, the third stretchable device 91 includes the stretchable laminate 21 including the fabric base material 31 having the exposed portion 31a, a fabric 111, and a fixing member 112 for fixing the exposed portion 31a of the fabric base material 31 provided in the stretchable laminate 21 and the fabric 111 as illustrated in FIG. 11. FIG. 11 is a sectional view illustrating another example of the stretchable device 91 according to an embodiment of the present invention.

Examples of the fixing member 112 include an adhesive and a thread. The thread used as the fixing member is preferably a conductive thread. When the fixing member is such a conductive thread, the fixing member can be used as an electrode or as ground in wiring on which an electronic component is mounted by bringing the fixing member into contact with the human body or the like.

It is preferable that the third stretchable device 91 has two or more fixing positions where the exposed portion 31*a* and the fabric 111 are fixed with the fixing member 112 as illustrated in FIG. 11 from the viewpoint of suitably fixing the stretchable laminate 21 to the fabric 111. When there are two or more fixing positions, it is preferable that the length of the fabric 111 present between the adjacent fixing positions is shorter than the length of the stretchable laminate 21 present between the adjacent fixing positions. In a case where the lengths are in such relation, the length of the fabric 111 present between the fixing positions is shorter than the length of the stretchable laminate 21 present between the fixing positions when the exposed portion 31*a* of the fabric base material 31 and the fabric 111 are fixed as illustrated in FIG. 11.

When fixing is performed in this way, the stretchable laminate can be fixed to the fabric without stretching the stretchable laminate. Even when the fabric is stretched, the stretchable laminate is not strongly pressed against the fabric. In other words, the stretchable laminate can have so-called play. This makes it possible to suppress that the stretchable laminate excessively adheres to the fabric and is damaged. For example, it is possible to suppress the occurrence of conduction failure of electronic components mounted on the stretchable circuit board.

The length of the fabric present between the adjacent fixing positions and the length of the stretchable laminate present between the adjacent fixing positions are the length of the fabric present between the fixing positions and the length of the stretchable laminate present between the fixing positions when the same two fixing positions are selected as two fixing positions where the exposed portion and the fabric are fixed. From this, the fixing position is the position where the exposed portion and the fabric are fixed. In the case of two fixing positions, each fixing position is the position where the distance between the two fixing positions is the closest. For example, when two fixing positions are formed using an adhesive as a fixing member, the two fixing positions are positions that are on the inner side of the region where the exposed portion and the fabric are fixed, and are respective positions where they are closest to each other. Even when two fixing positions are formed using a thread as a fixing member, the two fixing positions are respective positions where they are closest to each other.

Figure 12:
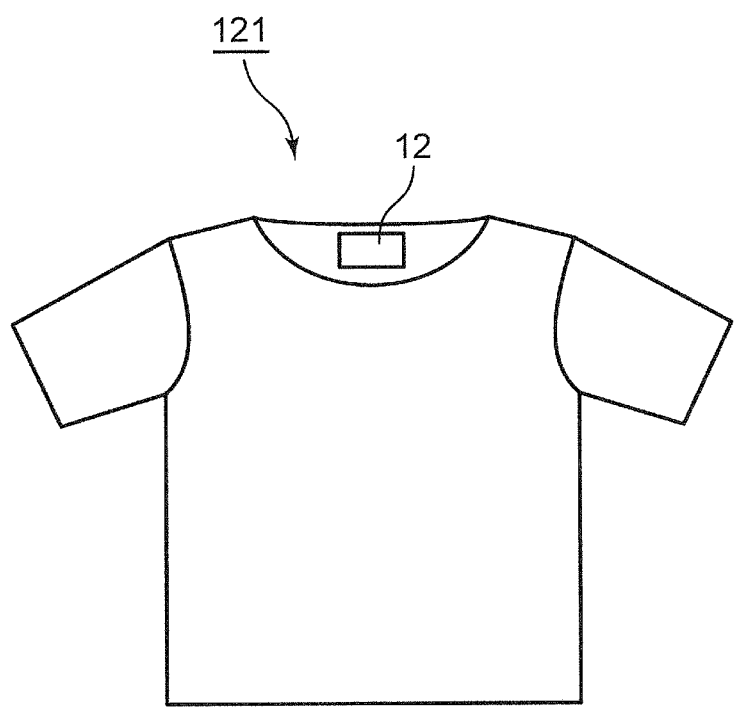
FIG. 12 is a schematic view illustrating an example of clothing to which a stretchable laminate according to an embodiment of the present invention is fixed.

Examples of the fabrics 92, 102, and 111 include fabrics constituting clothing. When the fabric is a fabric constituting clothing, the obtained clothing is clothing to which the stretchable circuit board is fixed. Examples of clothing to which the stretchable circuit board is fixed include clothing as illustrated in FIG. 12. With regard to clothing 121 to which the stretchable circuit board 12 is fixed, for example, when the electronic component provided on the stretchable circuit board is utilized for the purpose of acquiring the action log of a salesperson and the like, examples of the clothing include uniforms, and examples of the fabric include fabrics constituting uniforms. When the electronic component provided on the stretchable circuit board is used for sports purposes, examples of the clothing include sports uniforms and tee shirts worn during exercise, and examples of the fabric include fabrics constituting these. FIG. 12 is a schematic view illustrating an example of clothing to which the stretchable circuit board according to the present embodiment is fixed.

Examples of the fixing position of the stretchable circuit board on the clothing include a position where the electronic component of the stretchable circuit board suitably operates. Examples of the fixing position include the position that is the upper portion of the back side and the inner side when the clothing 121 is worn, and the position where the tag and the like are stuck, such as the position close to the hanger when the clothing is hung on a hanger.

Figure 13:
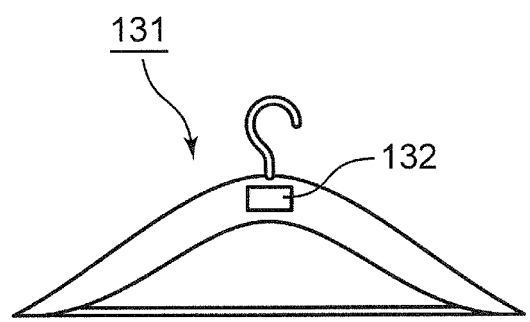
FIG. 13 is a schematic view illustrating an example of a clothing hanger for hanging clothing to which a stretchable laminate according to an embodiment of the present invention is fixed.

In the stretchable device, when the fabric is a fabric that constitutes clothing, it is preferable that the stretchable circuit board is fixed at a position where the electronic component to be provided on the stretchable circuit board can perform contactless communication or contactless power supply from a power transmission electronic component capable of performing contactless communication or contactless power supply with the electronic component to be provided on the stretchable circuit board when the clothing is hung on a clothing hanger including the power transmission electronic component. It is preferable that the clothing hanger includes the power transmission electronic component at a position where the electronic component to be provided on the stretchable circuit board can perform contactless communication or contactless power supply from the power transmission electronic component. Specific examples of a clothing hanger 131 include a hanger including a power transmission electronic component 132 at a position close to the position that is the upper portion of the back side and the inner side when the clothing is hung and when the clothing is worn as illustrated in FIG. 13. FIG. 13 is a schematic view illustrating an example of a clothing hanger for hanging clothing to which the stretchable circuit board according to an embodiment of the present invention is fixed. In this way, by only hanging clothing provided with the stretchable circuit board on the clothing hanger, contactless communication between the electronic component to be provided on the stretchable circuit board and the power transmission electronic component to be provided on the clothing hanger is possible or the electronic component to be provided on the stretchable circuit board can perform contactless power supply from the power transmission electronic component to be provided on the clothing hanger.

The clothing hanger may be configured so that, for example, a power transmission electronic component that performs contactless power supply with respect to the electronic component to be provided on the stretchable circuit board is detachable therefrom. This makes it possible to easily charge the power transmission electronic component. The clothing hanger may be configured so that, for example, a power transmission electronic component that performs contactless communication with the electronic component to be provided on the stretchable circuit board is detachable therefrom. This makes it possible to easily extract data from the power transmission electronic component. The time for which the clothing is hung on the clothing hanger is short, and this is effective when the clothing is wet with sweat and the like.

This application is based on Japanese Patent Application No. 2019-079144 filed on Apr. 18, 2019, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, there are provided a stretchable laminate capable of suitably fixing a stretchable circuit board to a fabric, a material for stretchable device capable of suitably fixing a stretchable circuit board to a fabric, and a stretchable device in which a stretchable circuit board is suitably fixed to a fabric.

The invention claimed is:

1. A stretchable device comprising:
   a stretchable laminate to be fixed to a fabric, the stretchable laminate including
      a stretchable circuit board including a stretchable insulating layer having an elongation rate of 10% or more,
      a fabric base material, and
      an adhesive layer that bonds the stretchable circuit board and the fabric base material together;
   the fabric that is different from the fabric base material; and
   a fixing member for fixing the stretchable laminate and the fabric;
   wherein the fabric base material has an exposed portion that is exposed when viewed from a stretchable circuit board side in a state where the stretchable circuit board and the fabric base material are laminated with the adhesive layer interposed therebetween, and
   the fixing member fixes the exposed portion and the fabric.

2. The stretchable device according to claim 1, wherein the exposed portion is a protruding portion, which protrudes from the stretchable circuit board, of the fabric base material in a state where the stretchable circuit board and the fabric base material are laminated with the adhesive layer interposed therebetween.

3. The stretchable device according to claim 1, wherein the adhesive layer is formed of a hot melt adhesive.

4. The stretchable device according to claim 1, wherein the stretchable insulating layer has a storage modulus of 500 kPa or more in a temperature range of 100° C. or more and less than 400° C.

5. The stretchable device according to claim 1, wherein the stretchable insulating layer has a thermal decomposition temperature of 270° C. or more.

6. The stretchable device according to claim 1, wherein the stretchable insulating layer contains
   a resin having a hydroxyl group in a molecule or
   a resin having an epoxy group in a molecule.

7. The stretchable device according to claim 1, wherein the stretchable circuit board further includes stretchable wiring.

8. The stretchable device according to claim 7, wherein at least a part of the stretchable wiring is formed of copper foil.

9. The stretchable device according to claim 7, further comprising an electronic component that is electrically connected to the stretchable wiring.

10. The stretchable device according to claim 9, wherein the electronic component is mounted on a face on an opposite side to a face in contact with the adhesive layer of the stretchable circuit board.

11. The stretchable device according to claim 9, wherein the electronic component is mounted on a face in contact with the adhesive layer of the stretchable circuit board.

12. The stretchable device according to claim 9, wherein
    the fabric is a fabric that constitutes clothing, and
    the stretchable circuit board is fixed at a position where the electronic component to be provided on the stretchable circuit board can perform contactless communication or contactless power supply from a power transmission electronic component capable of performing contactless communication or contactless power supply with the electronic component to be provided on the stretchable circuit board when the clothing is hung on a clothing hanger including the power transmission electronic component.

13. The stretchable device according to claim 1, wherein
    there are two or more fixing positions where the exposed portion and the fabric are fixed with the fixing member, and
    a length of the fabric present between the adjacent fixing positions is shorter than a length of the stretchable laminate present between the adjacent fixing positions.

14. The stretchable device according claim 1, wherein the fixing member is a conductive thread.

* * * * *